(12) United States Patent
Müller et al.

(10) Patent No.: US 7,981,214 B2
(45) Date of Patent: Jul. 19, 2011

(54) DEVICE AND PROCESS FOR THE CRYSTALLIZING OF NON-FERROUS METALS

(75) Inventors: Armin Müller, Freiberg (DE); Michael Ghosh, Dresden (DE); Jens Seidel, Freiberg (DE); Bert Geyer, Freiberg (DE)

(73) Assignee: Deutsche Solar GmbH, Freiberg (DE)

( * ) Notice: Subject to any disclaimer, the term of this patent is extended or adjusted under 35 U.S.C. 154(b) by 999 days.

(21) Appl. No.: 11/816,943

(22) PCT Filed: Mar. 11, 2006

(86) PCT No.: PCT/EP2006/002258
§ 371 (c)(1),
(2), (4) Date: Aug. 23, 2007

(87) PCT Pub. No.: WO2006/099955
PCT Pub. Date: Sep. 28, 2006

(65) Prior Publication Data
US 2008/0264207 A1 Oct. 30, 2008

(30) Foreign Application Priority Data
Mar. 23, 2005 (DE) .................. 10 2005 013 410

(51) Int. Cl.
*C30B 11/02* (2006.01)
(52) U.S. Cl. ............... 117/72; 117/73; 117/74; 117/13; 164/122.2
(58) Field of Classification Search ............. 117/72, 117/73, 74, 13; 164/122.2
See application file for complete search history.

(56) References Cited

U.S. PATENT DOCUMENTS

| 5,040,773 A | 8/1991 | Hackman |
| 6,383,285 B1 | 5/2002 | Wakita et al. |

FOREIGN PATENT DOCUMENTS

| DE | 33 23 896 A1 | 1/1985 |
| DE | 100 35 097 A1 | 2/2002 |
| DE | 102 34 250 A1 | 2/2004 |
| EP | 0 748 884 A1 | 12/1996 |
| EP | 1 162 290 A1 | 12/2001 |
| JP | 2000 001308 | 1/2000 |

*Primary Examiner* — Robert M Kunemund
(74) *Attorney, Agent, or Firm* — McGlew and Tuttle, P.C.

(57) ABSTRACT

In the case of a device for the melting and/or crystallizing of non-ferrous metals, especially of silicon, provision is made, for improving the quality of the crystallized and block-shaped non-ferrous metal, for there to be arranged around a container for receiving the non-ferrous metal at least one controllable cooling element for the active removal of heat from the non-ferrous metal.

20 Claims, 1 Drawing Sheet

US 7,981,214 B2

DEVICE AND PROCESS FOR THE CRYSTALLIZING OF NON-FERROUS METALS

CROSS REFERENCE TO RELATED APPLICATIONS

This application is a United States National Phase application of International Application PCT/EP2006/002258 and claims the benefit of priority under 35 U.S.C. §119 of DE 102005013410.6 filed Mar. 23, 2005, the entire contents of which are incorporated herein by reference.

FIELD OF THE INVENTION

The invention relates to a device for the melting and/or crystallizing of non-ferrous metals, especially of silicon. The invention further relates to a process for the melting and/or crystallizing of non-ferrous metals, especially of silicon. The invention furthermore relates to the use in photovoltaics of the non-ferrous metal, especially silicon, crystallized using the process according to the invention.

BACKGROUND OF THE INVENTION

It has long been known to have silicon melted down and crystallized in quartz molds to produce multi-crystalline silicon blocks for subsequent processing in photovoltaics. During the crystallizing and cooling of the silicon, heat is removed by the dissipation thereof to the outer walls of the mold and the surface of the silicon. A drawback of this process is that the silicon often cools non-uniformly, thus producing intensive thermal stresses which promote dislocation and the multiplication thereof and produce cracks in the solidified block-shaped silicon. The non-uniform cooling also promotes back diffusion of foreign matters, especially metals, from marginal regions into the interior of the block-shaped silicon. Both the dislocations and the back-diffused foreign matters act as recombination centers and reduce the photovoltaic efficiency of solar cells.

SUMMARY OF THE INVENTION

The object of the invention is to develop a device and a process for the melting and/or crystallizing of non-ferrous metals, especially of silicon, so as to increase the quality of the solidified non-ferrous metal and the resultant photovoltaic efficiency of solar cells made of the non-ferrous metal.

This object is achieved by a device for melting and crystallizing of non-ferrous metals, comprising a container for receiving a non-ferrous metal, at least one controllable heating element for the active supply of heat into the non-ferrous metal, and at least one controllable cooling element for the active removal of heat from the non-ferrous metal. The object is also attained by a process for melting of non-ferrous metals, including providing a container for receiving a solid non-ferrous metal, melting of the non-ferrous metal in the container, active removal of heat from the liquid non-ferrous metal using at least one controllable cooling element, and controlled crystallizing of the liquid non-ferrous metal in the container by controlling the removal of heat. The object is also attained by a process for crystallizing of non-ferrous metals, including providing a container for receiving a liquid non-ferrous metal, introduction of the already molten and liquid non-ferrous metal into the container, active removal of heat from the liquid non-ferrous metal using at least one controllable cooling element, and controlled crystallizing of the liquid non-ferrous metal in the container by controlling the removal of heat. The core of the invention is that the crystallizing of the non-ferrous metal is controlled. The term "controlling", under the terms of the present invention, refers to controlling in the narrower sense, without feedback of a measured variable characterizing the crystallization, but also regulation with feedback of a measured variable characterizing the crystallization. For controlling the crystallization process there is provided at least one controllable cooling element used for the active removal of heat from the non-ferrous metal. The controlled crystallizing of the liquid non-ferrous metal prevents thermal stresses, and this leads to a reduction in dislocations and of foreign materials back-diffused into the interior of the block-shaped non-ferrous metal. Fewer recombination centers are thus produced, thus improving the quality of the solidified non-ferrous metal and the photovoltaic efficiency of solar cells produced from the non-ferrous metal. A reduction in the cycle time during crystallization of the liquid non-ferrous metal and during subsequent cooling of the solidified, block-shaped non-ferrous metal is possible at the same time.

The various features of novelty which characterize the invention are pointed out with particularity in the claims annexed to and forming a part of this disclosure. For a better understanding of the invention, its operating advantages and specific objects attained by its uses, reference is made to the accompanying drawings and descriptive matter in which preferred embodiments of the invention are illustrated.

DESCRIPTION OF THE PREFERRED EMBODIMENTS

Figure 1:
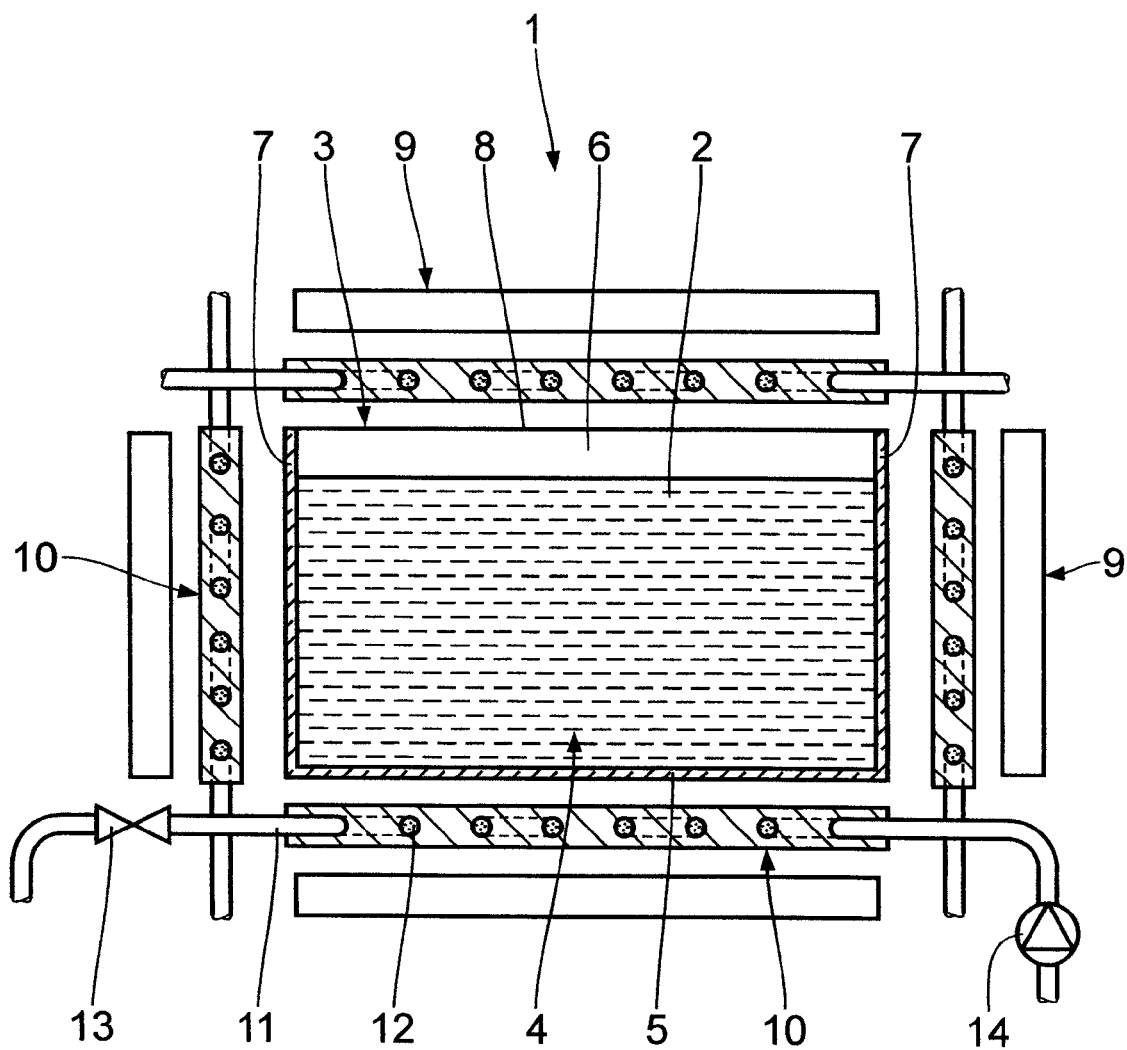
FIG. 1 is a schematic view of a device for the melting and/or crystallizing of non-ferrous metals.

A device, denoted in its entirety by reference numeral 1, for the melting and/or crystallizing of a non-ferrous metal 2, especially of silicon, has a mold which is configured as a container 3, is substantially in the form of an upwardly open cuboid and delimits on five sides a substantially cuboid-shaped interior 4. The mold 3 is made in one piece from quartz and has a mold base 5, two opposing mold lateral walls 6 and two opposing mold end walls 7. For filling the mold 3, a mold opening 8 is provided opposing the mold base 5. The interior 4 of the mold 3 is filled with silicon 2 almost up to the mold opening 8.

The respective outer walls of the mold base 5, the mold lateral wall 6, the mold end walls 7 and the mold opening 8 will also be referred to hereinafter as lateral surfaces, the lateral surfaces being substantially parallel to corresponding outer surfaces of the silicon 2 within the interior 4.

Arranged parallel to the lateral surfaces and set apart therefrom is a respective electrically heatable heating element 9 which may be controlled for the active and purposeful supply of heat into the silicon 2.

Alternatively, at least one, especially at least two, in particular at least four heating elements 9 may be arranged set apart from a corresponding number of lateral surfaces. Each heating element 9 extends substantially over the entire associated lateral surface. Apart from the heating element 9 opposing the mold opening 8, the heating elements 9 are defined relative to the mold 3. Alternatively, provision may be made for each heating element 9 to be movable, either manually or automatically, along the lateral surfaces using a drive (not shown), so the heating elements 9, when deactivated, do not oppose the associated lateral surfaces.

A controllable cooling element 10 is arranged between each heating element 9 and the associated lateral surface for the active removal of heat from the silicon 2. Each cooling element 10 is arranged substantially parallel to and set apart from the associated lateral surface, the cooling element 10 extending over the entire lateral surface. Apart from the cooling element 10 opposing the mold opening 8, the cooling elements 10 are defined relative to the mold 3. Alternatively, provision may be made for each cooling element 10 to be movable, either manually or automatically, along the lateral surfaces using a drive (not shown), so the cooling elements 10, when deactivated, do not oppose the associated lateral surfaces.

As an alternative to the arrangement of the cooling elements 10 between the heating elements 9 and the associated lateral surfaces, provision may be made for either a heating element 9 or a cooling element 10 to be arranged opposing a lateral surface. For example, two heating elements 9 may be arranged opposing the mold lateral wall 6 and two cooling elements 10 opposing the mold base 5 and the mold opening 8.

Each cooling element 10 has a meandering cooling tube 11 through which a cooling fluid, especially a cooling gas 12, flows for the removal of heat. The cooling tubes 11 are made either of a non-metallic material having high thermal stability, especially of graphite, or of a metallic material having high thermal stability. A material having high thermal stability, under the terms of the present invention, has a melting point of greater than 1,600° C., especially of greater than 2,000° C. and in particular of greater than 2,400° C.

Furthermore, each cooling element 10 has a flow control element 13 in the form of a controllable valve for controlling the flow rate of the cooling gas 12. A pressure control element 14, in the form of a controllable pump, is also provided for controlling the pressure of the cooling gas 12. Each cooling element 10 is connected by the cooling tube 11 to a heat exchanger (not shown) and forms a closed circuit for the cooling gas 12, the heat absorbed by the cooling gas 12 being removed in the heat exchanger. Alternatively, the cooling elements 10 can also form an open circuit for the cooling gas 12, so the cooling gas 12 is continuously replaced.

The mode of operation of the device 1 according to the invention will be described hereinafter. First of all, the mold 3 is filled with powdered or granular silicon 2. For this purpose, the heating element 9, opposing the mold opening 8, and cooling element 10 are positioned in such a way that the mold opening 8 is freely accessible for the purposes of filling. After filling, the heating element 9, opposing the mold opening 8, and cooling element 10 are arranged, for heating and cooling the silicon 2, parallel to and opposing the mold opening 8. The heating elements 9 are then electrically heated in such a way that heat is actively supplied to the silicon 2 which melts completely. The heat passes in this case between the meandering cooling tubes 11 of the cooling elements 10. Alternatively, liquid silicon 2 which has already melted may be introduced into the mould 3.

Once the silicon 2 has melted, it is in liquid form within the mold 3. Directed and controlled crystallizing and solidification of the silicon 2 then ensue. The term "directed", as used in the present invention, means upward, i.e. counter to gravity. For controlled crystallization of the liquid silicon 2, heat is actively removed from the liquid silicon 2 using the controllable cooling elements 10. The cooling gas 12 which flows through the cooling tubes 11 absorbs and discharges the irradiated heat from the silicon 2. In principle, the cooling gas 12 used may be in the form of any desired gases or mixtures of gases such as, for example, argon.

For controlling the removal of heat, the flow rate of the cooling gas 12 is controlled using the valve 13 and/or the pressure of the cooling gas 12 is controlled using the pump 14. The cooling elements 10 are operated at a cooling gas 12 pressure of from 10 mbar to 10 bar, especially from 500 mbar to 8 bar, and in particular from 1 bar to 5 bar.

Furthermore, the cooling elements 10 are operated at a cooling gas 12 flow rate of from 1 $m^3/h$ to 10,000 $m^3/h$, especially from 50 $m^3/h$ to 5,000 $m^3/h$ and in particular from 100 $m^3/h$ to 1,000 $m^3/h$.

During crystallization, the cooling elements 10 are activated in such a way that the crystallization is carried out in a targeted manner. In particular, the cooling element 10 opposing the mold base 5 is activated so as to have an intensified cooling effect compared to the other cooling elements 10. The controlled crystallization of the liquid silicon 2 prevents thermal stresses resulting from excessively rapid or non-uniform cooling. This reduces dislocations and cracks in the solidified silicon 2. In addition, the controlled removal of heat at the exposed outer surface, opposing the mold opening 8, of the silicon 2 reduces during cooling back-diffusion of foreign matters, especially of metallic foreign matters, from an edge region of the block-shaped silicon 2 into the interior. The lower number of dislocations and foreign matters reduces the possible recombination centers and increases the photovoltaic efficiency of solar cells produced from the block-shaped silicon 2. The active and controllable removal of heat from the silicon 2 also reduces the cycle time during the production of block-shaped, solid silicon 2, especially in the cooling phase of the silicon 2 which has already solidified. In addition, the flexibly and rapidly controllable cooling of the silicon 2 allows purposeful adjustment and adaptation of the quality of the solidified silicon 2 as a function of the cooling rates.

As an alternative to the above-described embodiment, the silicon 2 may also be melted and crystallized in separate devices.

While specific embodiments of the invention have been shown and described in detail to illustrate the application of the principles of the invention, it will be understood that the invention may be embodied otherwise without departing from such principles.

The invention claimed is:

1. A device for melting and crystallizing of non-ferrous metals, the device comprising:
   a container for receiving a non-ferrous metal;
   at least one controllable heating element for the active supply of heat into the non-ferrous metal; and
   at least two controllable cooling elements for the active removal of heat from the non-ferrous metal, said container having substantially the shape of a cuboid having six lateral surfaces, wherein two respective cooling elements are arranged on opposing lateral surfaces.

2. A device according to claim 1, wherein the at least two cooling elements are arranged substantially plane and parallel to at least one lateral surface.

3. A device according to claim 1, wherein at least one of said two cooling elements is arranged at least on the at least one lateral side toward which the container is open.

4. A device according to claim 1, wherein the at least two cooling elements are arranged between the container and the at least one heating element.

5. A device according to claim 1, wherein the at least two cooling elements have at least one cooling tube for the passage of a cooling gas.

6. A device according to claim 1, wherein at least one of the at least one heating element and the at least two cooling elements are movable along at least one lateral surface.

7. A process for melting non-ferrous metals, the process comprising the following steps:
providing a container for receiving a solid non-ferrous metal, said container having substantially the shape of a cuboid with six lateral surfaces;
melting of the non-ferrous metal in the container;
active removal of heat from the liquid non-ferrous metal using at least two controllable cooling elements, one of said two cooling elements being arranged on one of said lateral surfaces, another one of said cooling elements being arranged on another one of said lateral surfaces, said one of said lateral surfaces being opposite said another one of said lateral surfaces; and
controlled crystallizing of the liquid non-ferrous metal in the container by controlling the removal of heat with said at least two controllable cooling elements.

8. A process according to claim 7, wherein a cooling fluid passes at least in part through the at least two cooling elements.

9. A process according to claim 8, wherein the active removal of heat is controlled by at least one of the pressure of the cooling fluid and the flow rate of the cooling fluid.

10. A process for crystallizing of non-ferrous metals, the process comprising the following steps:
providing a container for receiving a liquid non-ferrous metal, said container comprising six lateral surfaces, each of said six lateral surfaces being adjacent to another one of said six lateral surfaces such that said container has a substantially cuboid shape;
introduction of the already molten and liquid non-ferrous metal into the container;
active removal of heat from the liquid non-ferrous metal using at least a first controllable cooling element and a second controllable cooling element, said first controllable cooling element being arranged on a first one of said six lateral surfaces, said second controllable cooling element being arranged on a second one of said six lateral surfaces, said first one of said six lateral surfaces being opposite said second one of said six lateral surfaces; and
controlled crystallizing of the liquid non-ferrous metal in the container by controlling the removal of heat.

11. A process according to claim 10, wherein a cooling fluid passes at least in part through the at least two cooling elements.

12. A process according to claim 11, wherein the active removal of heat is controlled by at least one of the pressure of the cooling fluid and the flow rate of the cooling fluid.

13. A device according to claim 1, further comprising:
a second controllable heating element;
a third controllable heating element;
a third controllable cooling element, one of said two controllable cooling elements being arranged between said at least one controllable heating element and one of said six lateral surfaces, another one of said two controllable cooling elements being arranged between said second controllable heating element and another one of said six lateral surfaces, said third controllable cooling element being arranged between said third controllable heating element and yet another one of said six lateral surfaces.

14. A method according to claim 7, further comprising:
providing a second controllable heating element;
providing a third controllable heating element;
providing a third controllable cooling element, one of said two controllable cooling elements being arranged between said at least one controllable heating element and said one of said lateral surfaces, another one of said two controllable cooling elements being arranged between said second controllable heating element and said another one of said lateral surfaces, said third controllable cooling element being arranged between said third controllable heating element and yet another one of said six lateral surfaces.

15. A process according to claim 10, further comprising:
providing a second controllable heating element;
providing a third controllable heating element;
providing a third controllable cooling element, said first controllable cooling element being arranged between said at least one controllable heating element and said first one of said six lateral surfaces, said second controllable cooling element being arranged between said second controllable heating element and said second one of said lateral surfaces, said third controllable cooling element being arranged between said third controllable heating element and a third one of said six lateral surfaces.

16. A device according to claim 13, further comprising:
a fourth controllable heating element;
a fourth controllable cooling element, said fourth controllable cooling element being arranged between said fourth controllable heating element and a fourth one of said lateral surfaces.

17. A method according to claim 15, further comprising:
providing a fourth controllable heating element;
providing a fourth controllable cooling element, said fourth controllable cooling element being arranged between said fourth controllable heating element and a fourth one of said lateral surfaces.

18. A process according to claim 14, further comprising:
providing a fourth controllable heating element;
providing a fourth controllable cooling element, said fourth controllable cooling element being arranged between said fourth controllable heating element and a fourth one of said six lateral surfaces.

19. A device according to claim 16, wherein each of said lateral surfaces is perpendicular to another one of said lateral surfaces.

20. A method according to claim 17, wherein each of said lateral surfaces is perpendicular to another one of said lateral surfaces.

* * * * *